(12) United States Patent
Chan et al.

(10) Patent No.: US 8,268,652 B2
(45) Date of Patent: Sep. 18, 2012

(54) METHOD FOR DISTRIBUTING FLUORESCENCE ONTO LED CHIP

(75) Inventors: Shiun-Wei Chan, Hsinchu (TW); Chih-Hsun Ke, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/149,781

(22) Filed: May 31, 2011

(65) Prior Publication Data

US 2012/0094404 A1 Apr. 19, 2012

(30) Foreign Application Priority Data

Oct. 18, 2010 (CN) .......................... 2010 1 0510416

(51) Int. Cl.
*H01L 21/66* (2006.01)
*H01L 21/00* (2006.01)
(52) U.S. Cl. ........... 438/27; 438/106; 438/116; 438/127
(58) Field of Classification Search .................. None
See application file for complete search history.

(56) References Cited

U.S. PATENT DOCUMENTS

| | | | | |
|---|---|---|---|---|
| 5,976,916 A | * | 11/1999 | Kuwamura et al. | 438/126 |
| 6,707,247 B2 | * | 3/2004 | Murano | 313/501 |
| 7,999,368 B2 | * | 8/2011 | Yim et al. | 257/686 |
| 2003/0085475 A1 | * | 5/2003 | Im et al. | 257/796 |
| 2007/0264739 A1 | * | 11/2007 | Chew | 438/46 |
| 2012/0061709 A1 | * | 3/2012 | Pachler | 257/98 |
| 2012/0061716 A1 | * | 3/2012 | Yu et al. | 257/99 |

\* cited by examiner

*Primary Examiner* — Charles Garber
*Assistant Examiner* — Evren Seven
(74) *Attorney, Agent, or Firm* — Altis Law Group, Inc.

(57) ABSTRACT

A method for distributing fluorescence onto a light emitting diode chip includes steps: providing a base; mounting the LED chip having a light-emergent face on the base; disposing a baffle sleeve on the base whereby the baffle sleeve surrounds the LED chip; disposing a solid fusible block with the fluorescence mixed therein on the LED chip; heating the solid fusible block to be in a liquid state, and the fusible block flowing over the light-emergent face of the LED chip; and cooling the fusible block to be in a solid state again.

13 Claims, 9 Drawing Sheets

METHOD FOR DISTRIBUTING FLUORESCENCE ONTO LED CHIP

BACKGROUND

1. Technical Field

The present disclosure relates to a method for distributing fluorescence onto a light emitting diode (LED) chip.

2. Description of Related Art

As a new type of light source, an LED package is widely used in various applications. An LED package often includes an LED chip to emit light, a substrate supporting the LED chip, and fluorescence used for changing color of light from the LED chip into a different color. A conventional method for distributing fluorescence on the chip in the art is to dispense adhesive containing fluorescence on the chip by a tool. The method can avoid waste of the fluorescence. However, the method also has some problems such as a process of the method is complicated and it is difficult to uniformly apply the fluorescence over the chip. Therefore, the method may cause a yellow annulus appearing in the light emitted from the LED; such an LED with an uneven light color is undesirable, whereby a yield rate of the LED manufactured by the conventional method is low.

What is needed, therefore, is a method for distributing fluorescence onto a light emitting diode which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Referring to FIGS. 1-5, steps of a process for distributing fluorescence 20 onto an LED (light emitting diode) chip 10 in accordance with a first embodiment of the present disclosure are disclosed.

Figure 1:
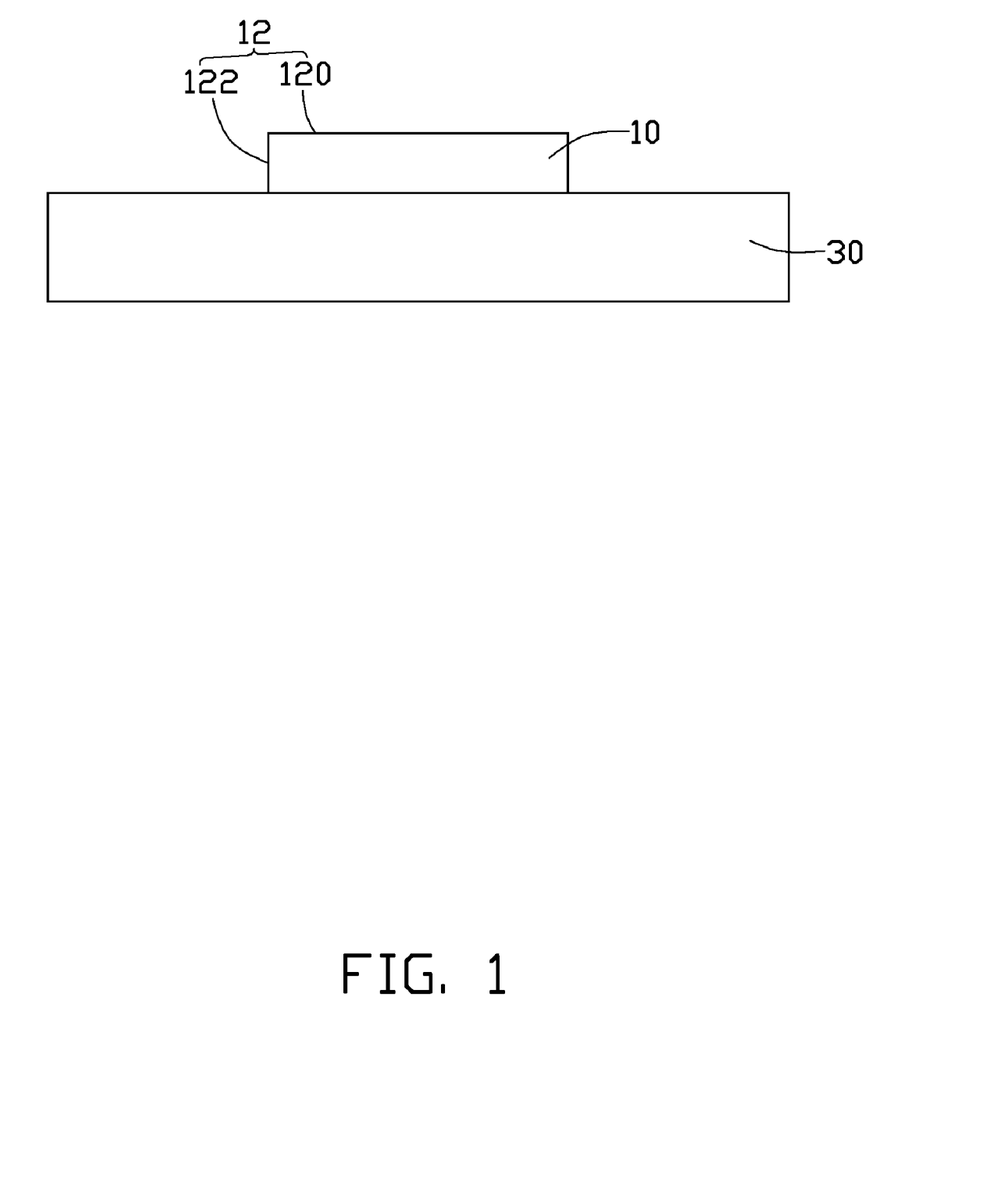
FIG. 1 shows a first step of a process for distributing fluorescence onto an LED chip in accordance with a first embodiment of the present disclosure.

Firstly, a base 30 on which the LED chip 10 is mounted is provided as shown in FIG. 1. The base 30 may be made of silicon or ceramic such as $Al_2O_3$ or AlN. The LED chip 10 is disposed on a top face of the base 10. The LED chip 10 may be made of GaN, AlGaN, AlInGaN or other suitable light emitting materials. The LED chip 10 has a light-emergent face 12, which comprises a top face 120 of the LED chip 10 and a lateral face 122 of the LED chip 10.

Figure 2:
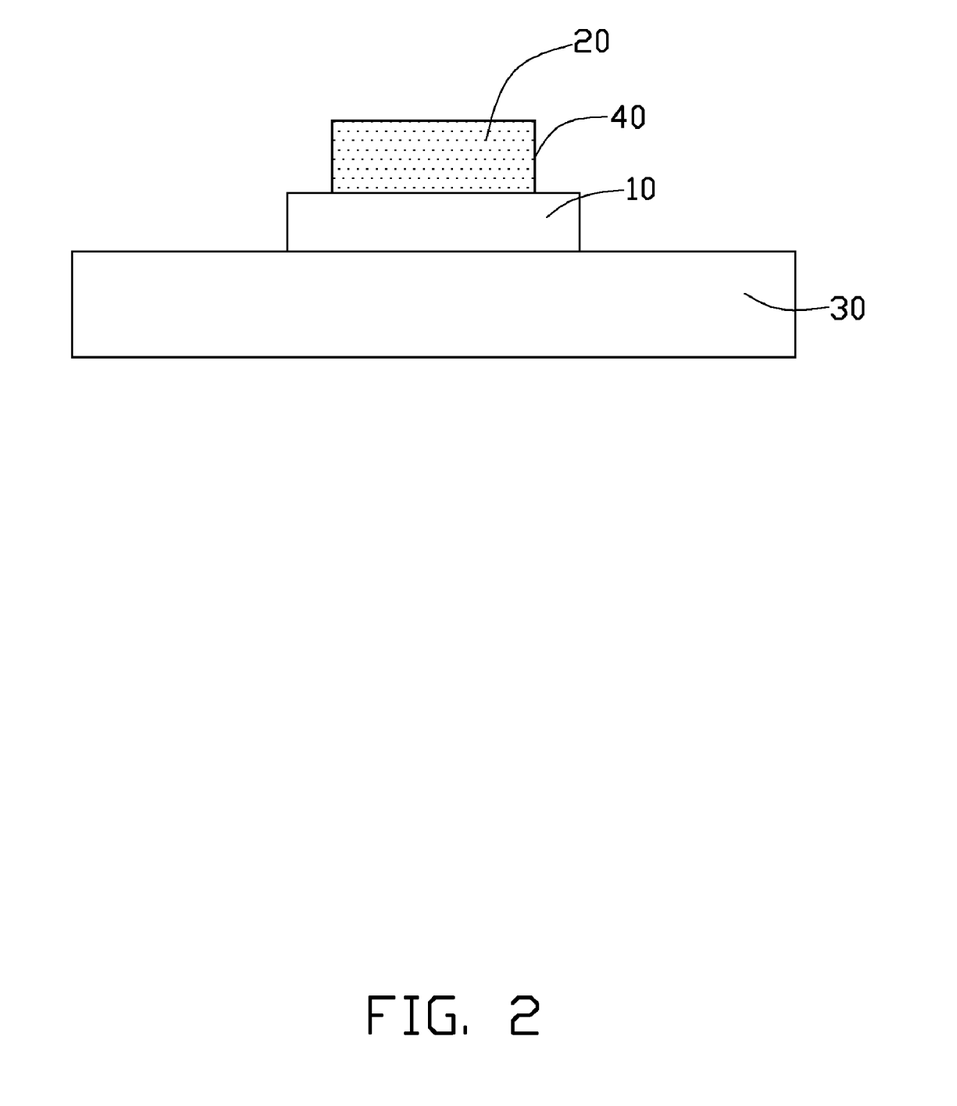
FIG. 2 shows a second step of the process for distributing fluorescence onto the LED chip in accordance with the first embodiment of the present disclosure.

Then a fusible block 40 is disposed on the LED chip 10 as shown in FIG. 2. The fusible block 40 is made of thermoplastic materials. A melting point of the fusible block 40 is preferably selected between 120 degrees centigrade and 300 degrees centigrade. In this step, the fusible block 40 is in a solid state. In this embodiment, a bottom face of the fusible block 40 is smaller than the top face 120 of the LED chip 10.

The fluorescence 20 is mixed into the fusible block 40. The fluorescence 20 is YAG, TAG, silicate, nitride, nitrogen oxides, phosphide, arsenide, telluride or sulfide.

Figure 3:
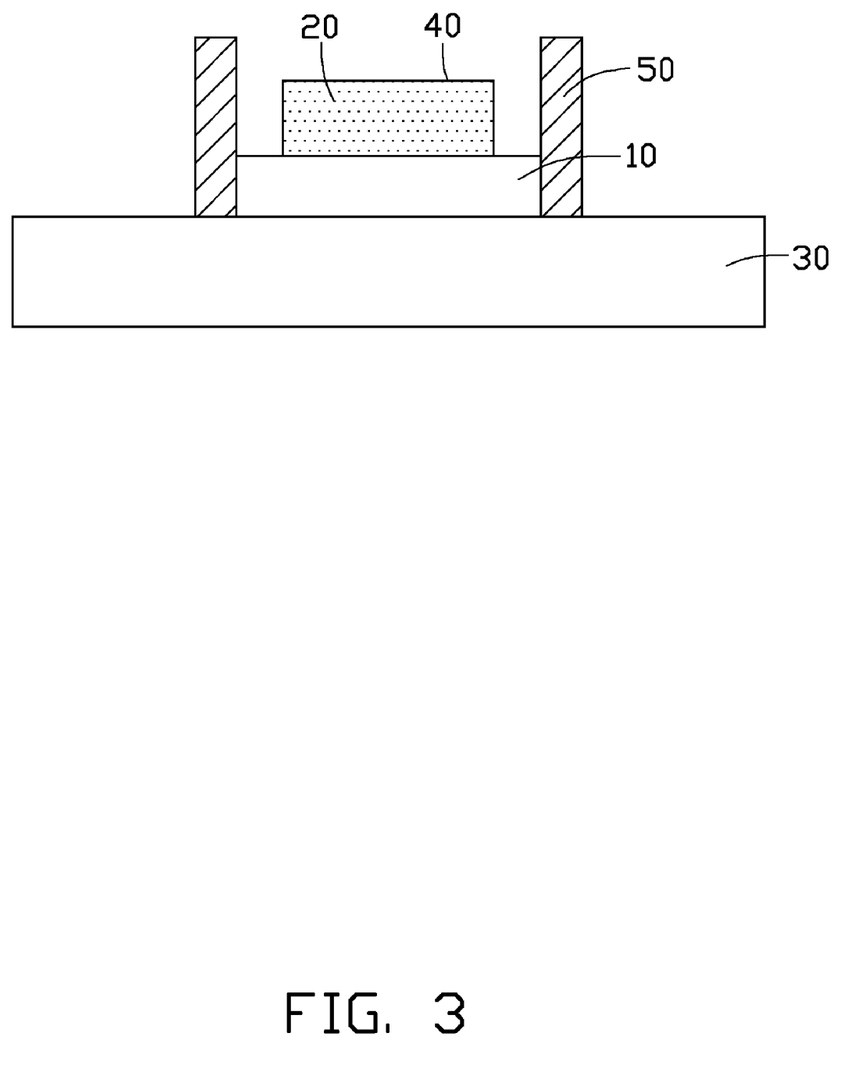
FIG. 3 shows a third step of the process for distributing fluorescence onto the LED chip in accordance with the first embodiment of the present disclosure.

Referring to FIG. 3, an annular baffle sleeve 50 is provided. The baffle sleeve 50 is perpendicularly disposed on the base 30, and surrounds the LED chip 10. In the first embodiment of this disclosure, the baffle sleeve 50 is attached to an outer periphery of the LED chip 10, and the lateral face 122 of the LED chip 10 is attached to the baffle sleeve 50.

Figure 4:
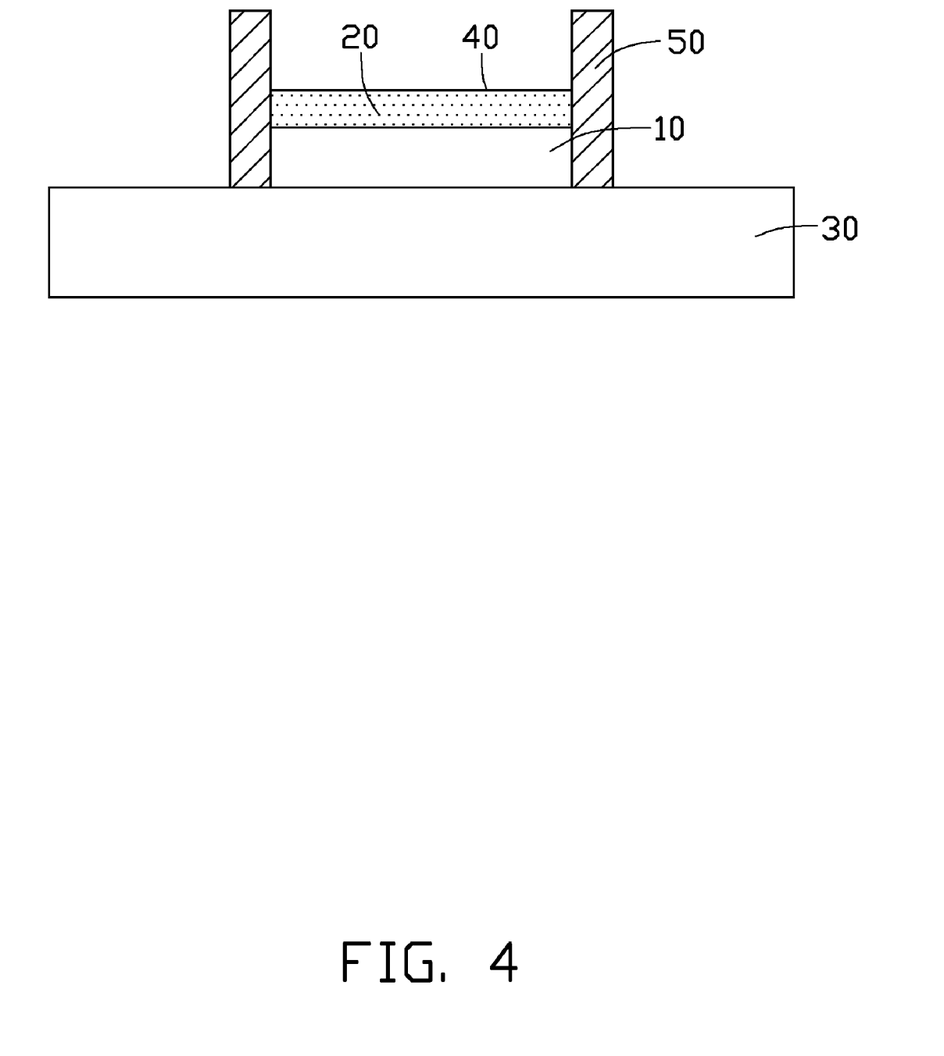
FIG. 4 shows a forth step of the process for distributing fluorescence onto the LED chip in accordance with the first embodiment of the present disclosure.

Referring to FIG. 4 also, then the fusible block 40 is heated to be in a liquid state, and the liquid fusible block 40 flows to reach an inside of the baffle sleeve 50, and locate over the top face 120 of the LED chip 10.

Figure 5:
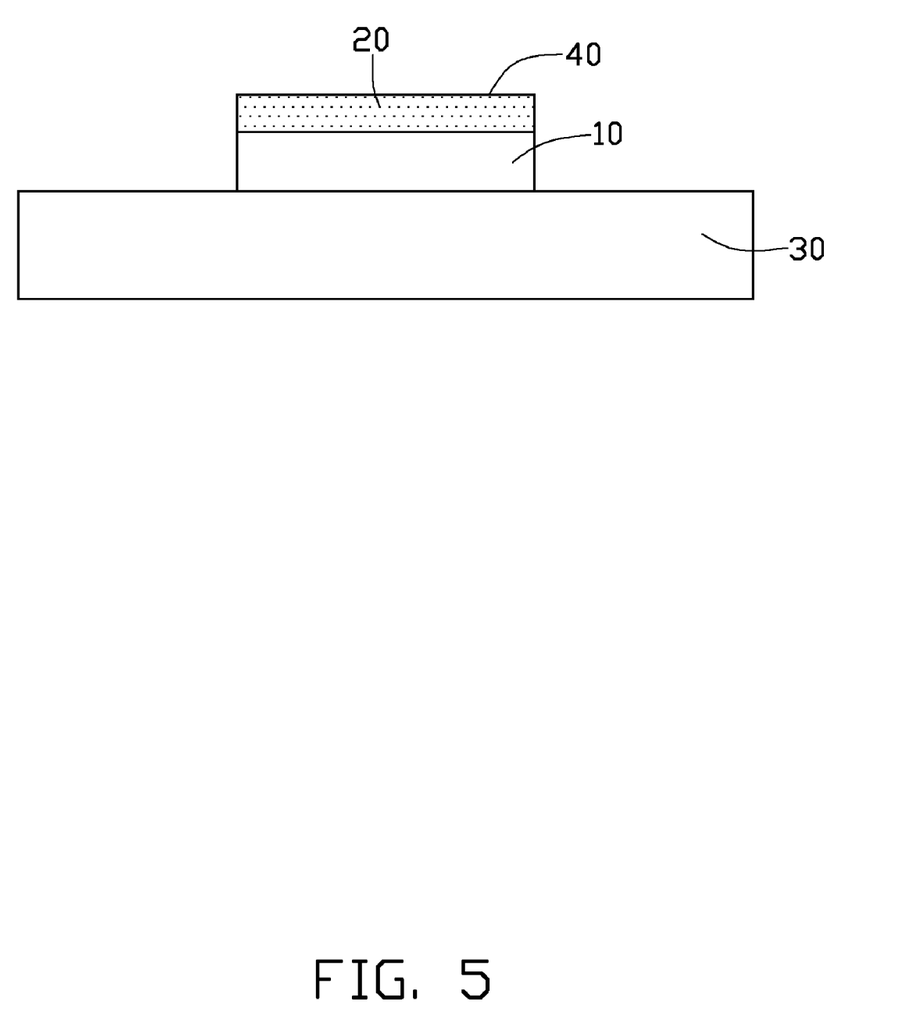
FIG. 5 shows a fifth step of the process for distributing fluorescence onto the LED chip in accordance with the first embodiment of the present disclosure.

Finally, the liquid fusible block 40 is cooled to be in the solid state again, and the baffle sleeve 50 is moved away, whereby the fusible block 40 with the fluorescence 20 mixed therein is distributed onto the top face 120 of the LED chip 10, as shown in FIG. 5.

Figure 6:
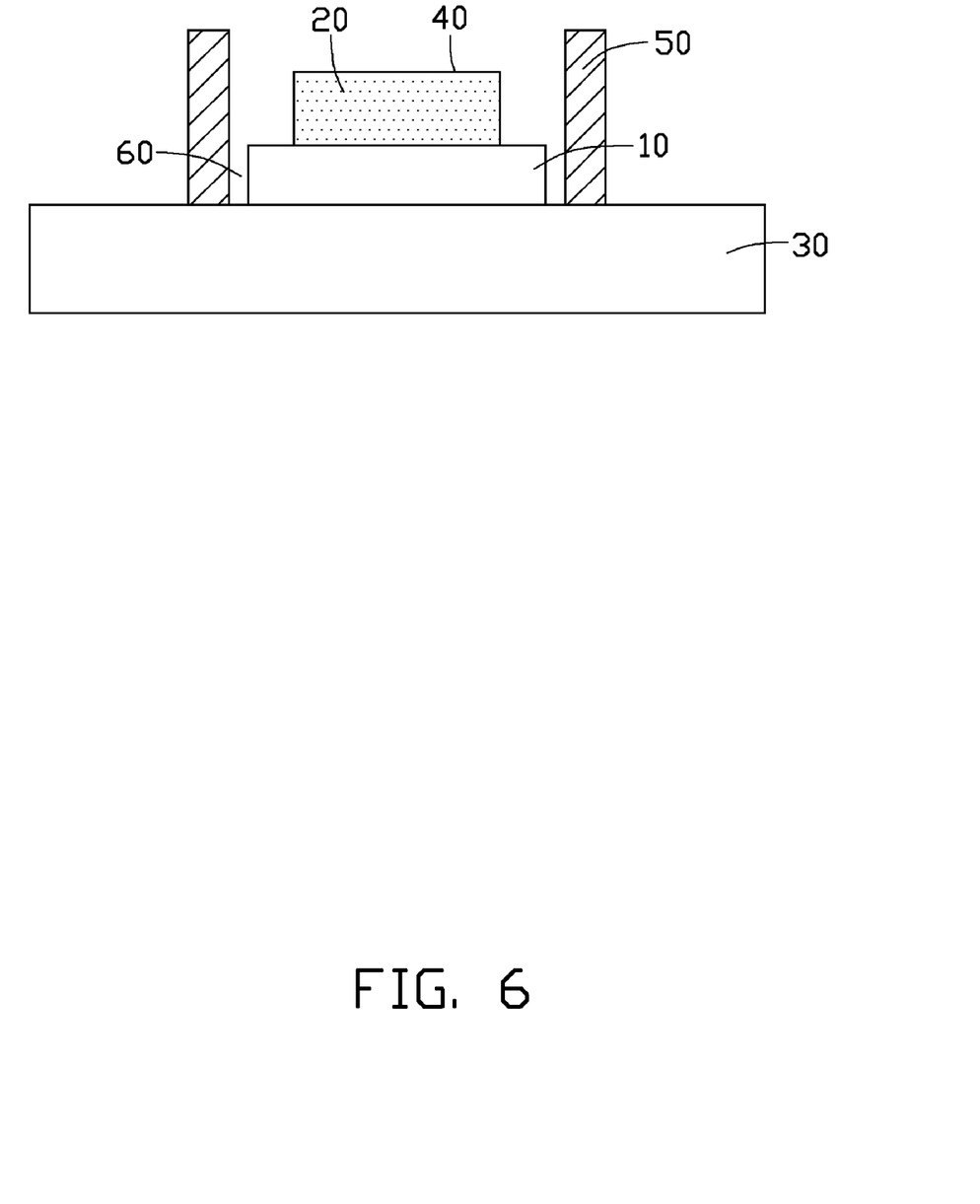
FIG. 6 is a view similar to FIG. 3, and shows a third step of the process for distributing fluorescence onto the LED chip in accordance with a second embodiment of the present disclosure.
Figure 7:
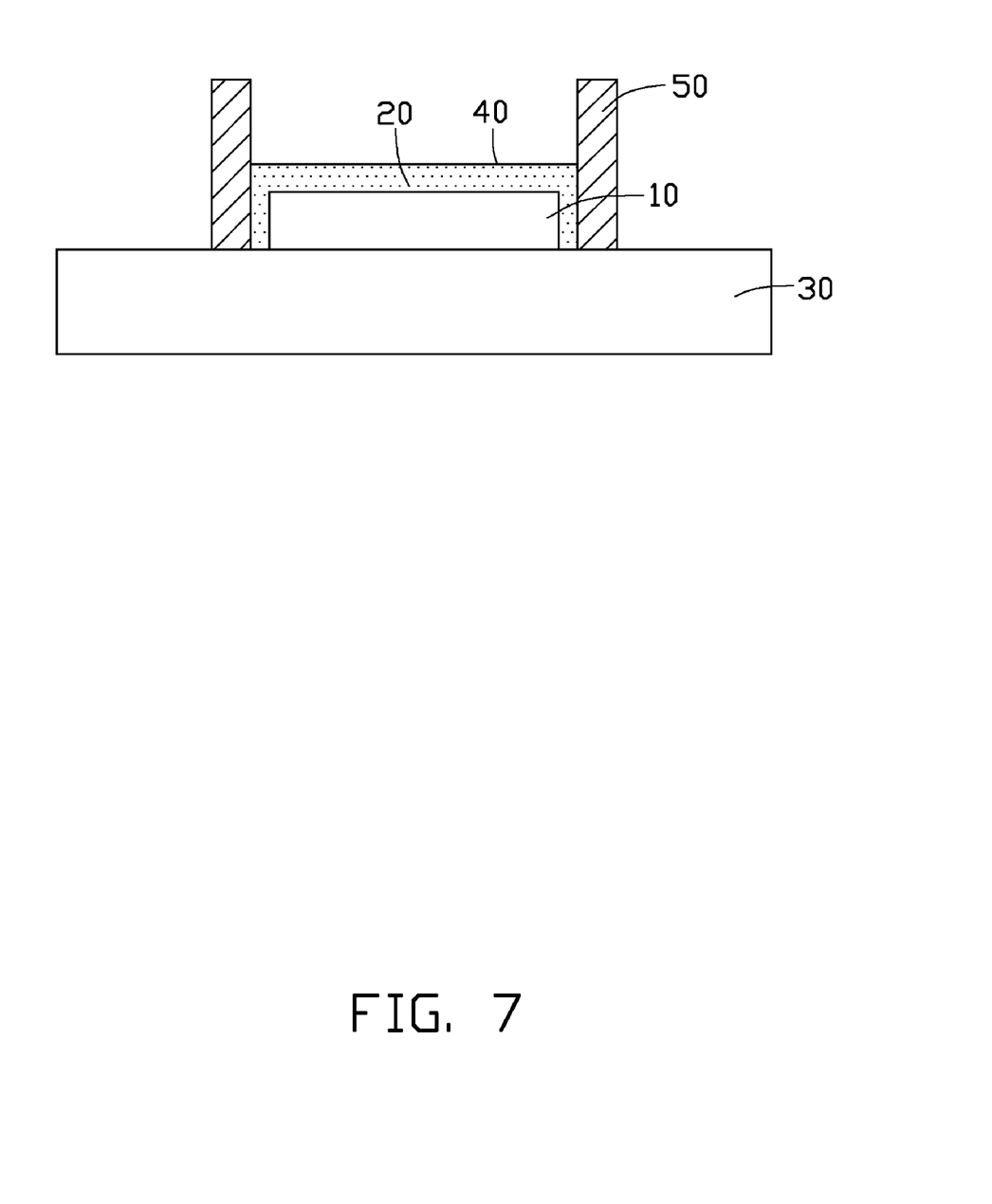
FIG. 7 is a view similar to FIG. 4, and shows a fourth step of the process for distributing fluorescence onto the LED chip in accordance with the second embodiment of the present disclosure.

Referring to FIG. 6 also, a second embodiment differs from the first embodiment in the position of the baffle sleeve 50. In the second embodiment, the baffle sleeve 50 surrounds the LED chip 10, and the baffle sleeve 50 is spaced from the LED chip 10, thereby forming a gap 60 between the baffle sleeve 50 and the lateral face 122 of the LED chip 10. Referring to FIG. 7 also, then the fusible block 40 is heated to be in a liquid state, and the liquid fusible block 40 flows to reach an inside of the baffle sleeve 50, and the gap 60 is filled with the fusible block 40, whereby the fusible block 40 covers all of the light-emergent face 12 of the LED chip 10, inclusive of the top face 120 and the lateral face 122. Finally, the liquid fusible block 40 is cooled to be in the solid state again, and the baffle sleeve 50 is moved away, whereby the fusible block 40 with the fluorescence 20 mixed therein is distributed onto the light-emergent face 12 of the LED chip 10.

Figure 8:
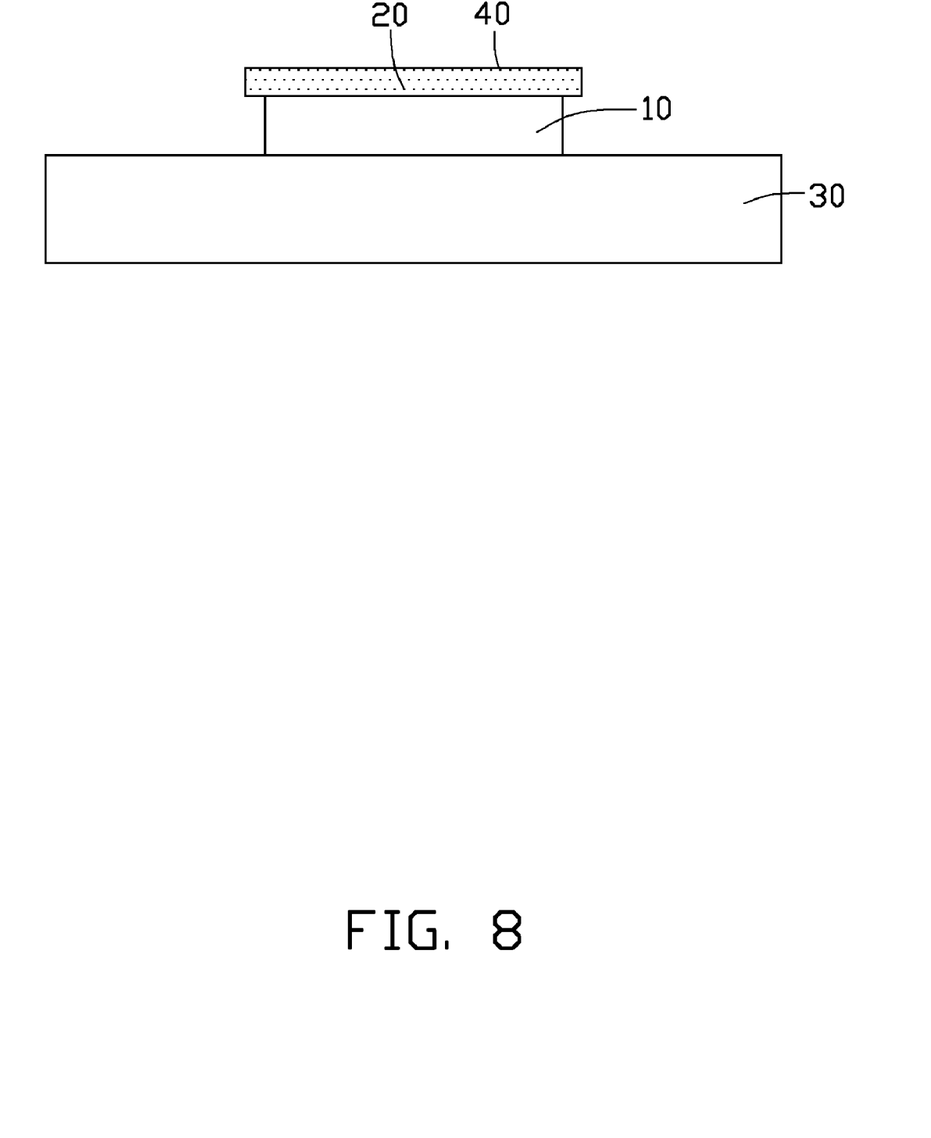
FIG. 8 is a view similar to FIG. 2, and shows a different fusible block.
Figure 9:
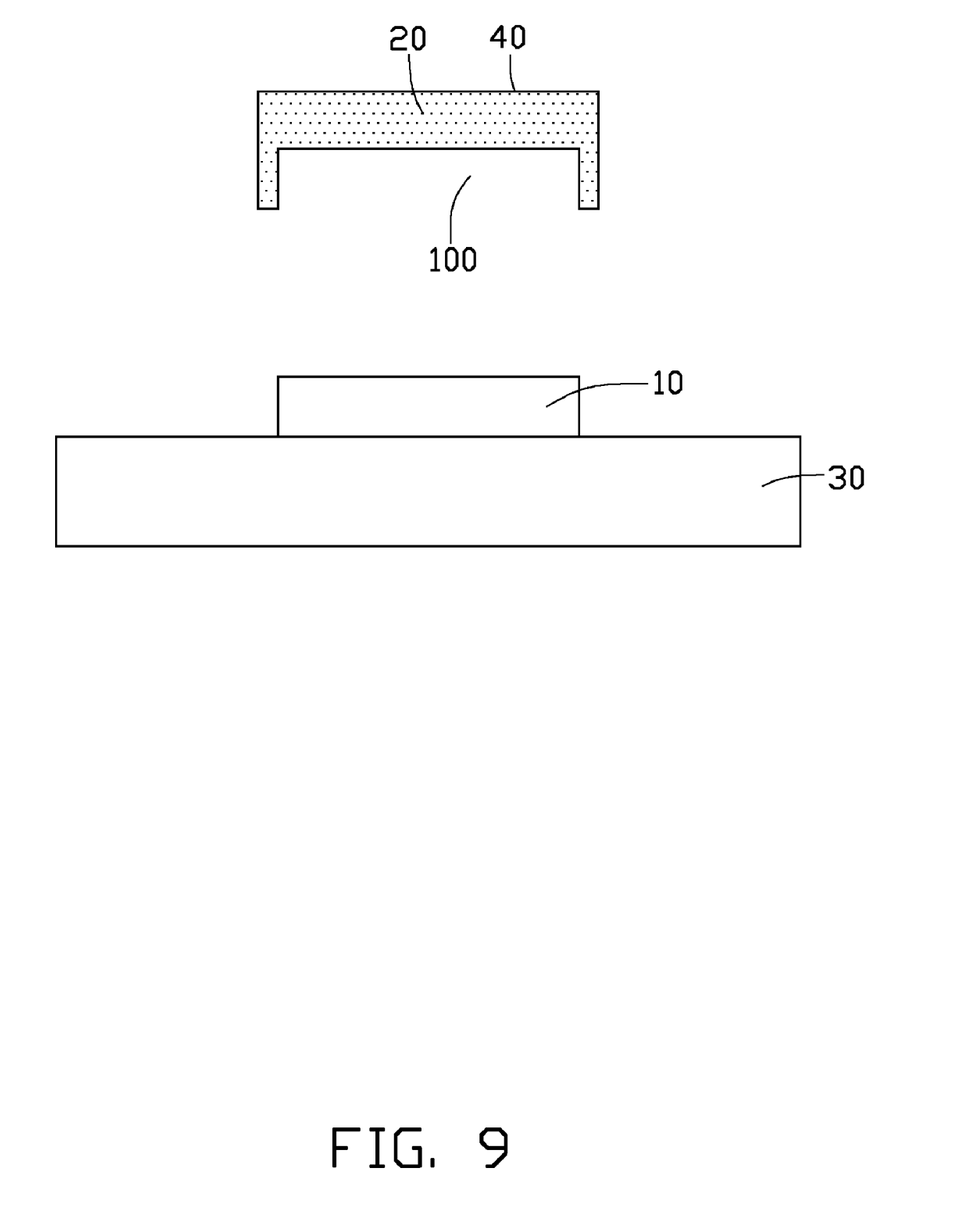
FIG. 9 is a view similar to FIG. 2, and shows another different fusible block.

It can be understood that, the shape and dimension of the fusible block 40 is variable. An elongated fusible block 40 is provided as shown in FIG. 8; that is, a bottom face of the fusible block 40 is larger than the top face 120 of the LED chip 10. Referring to FIG. 9, in order to realize convenient position between the fusible block 40 and the LED chip 10 before heating, a fusible block 40 having a recession 100 defined at a bottom thereof is provided. The LED chip 10 is received in the recession 100 of the fusible block 40.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A method for distributing fluorescence onto an LED (light emitting diode) chip, comprising steps of:
   providing a base;
   mounting the LED chip on the base, the LED chip having a light-emergent face;
   disposing a baffle sleeve on the base, the baffle sleeve surrounding the LED chip;
   disposing a solid fusible block on the LED chip, the solid fusible block having the fluorescence mixed therein, and the solid fusible block defining a recession at a bottom thereof to receive the LED chip;
   heating the solid fusible block to be in a liquid state, and the fusible block flowing over the light-emergent face of the LED chip; and
   cooling the fusible block to be in a solid state again.

2. The method as claimed in claim 1, wherein the light-emergent face comprises a top face and a lateral face of the LED chip.

3. The method as claimed in claim 2, wherein the baffle sleeve is attached to the lateral face of the LED chip.

4. The method as claimed in claim 2, wherein the baffle sleeve is spaced from the LED chip.

5. The method as claimed in claim 2, wherein the fluorescence is distributed all over the light-emergent face, inclusive of the top face and the lateral face of the LED chip.

6. The method as claimed in claim 1, wherein the fusible block is made of thermoplastic materials.

7. The method as claimed in claim 6, wherein a melting point of the fusible block is between 120 degrees centigrade and 300 degrees centigrade.

8. The method as claimed in claim 1, wherein the fluorescence is YAG, TAG, silicate, nitride, nitrogen oxides, phosphide, arsenide, telluride or sulfide.

9. The method as claimed in claim 1, wherein the base is made of silicon or ceramic.

10. A method for distributing fluorescence onto an LED (light emitting diode) chip, comprising steps of:
    providing a base;
    mounting the LED chip having a light-emergent face on the base;
    disposing a solid fusible block on the LED chip, the fusible block having the fluorescence mixed therein, and the fusible block defining a recession at a bottom thereof to receive the LED chip;
    heating the solid fusible block to be in a liquid state, and the fusible block flowing over the light-emergent face of the LED chip; and
    cooling the fusible block to be in a solid state again.

11. The method as claimed in claim 10, wherein the fusible block is made of thermoplastic materials.

12. The method as claimed in claim 11, wherein a melting point of the fusible block is between 120 degrees centigrade and 300 degrees centigrade.

13. The method as claimed in claim 10, wherein the fluorescence is YAG, TAG, silicate, nitride, nitrogen oxides, phosphide, arsenide, telluride or sulfide.

* * * * *